(12) United States Patent
Miller

(10) Patent No.: US 7,848,125 B2
(45) Date of Patent: Dec. 7, 2010

(54) KEEP-ALIVE FOR POWER STAGE WITH MULTIPLE SWITCH NODES

(75) Inventor: Peter James Miller, Manchester, NH (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 12/288,485

(22) Filed: Oct. 21, 2008

(65) Prior Publication Data

US 2010/0097123 A1    Apr. 22, 2010

(51) Int. Cl.
*H02M 3/18* (2006.01)

(52) U.S. Cl. ........................................................ 363/59

(58) Field of Classification Search .................. 363/59; 323/282, 288
See application file for complete search history.

(56) References Cited

U.S. PATENT DOCUMENTS

| 5,305,338 | A | * | 4/1994 | Wakata et al. | ............ 372/38.03 |
|---|---|---|---|---|---|
| 5,436,824 | A | * | 7/1995 | Royner et al. | .................. 363/89 |
| 7,019,474 | B2 | * | 3/2006 | Rice et al. | .............. 318/400.26 |
| 7,385,445 | B2 | * | 6/2008 | Wright | .......................... 330/51 |
| 2005/0102128 | A1 | * | 5/2005 | Wilhelm | ....................... 703/23 |
| 2006/0244393 | A1 | * | 11/2006 | Zane | ...................... 315/209 M |
| 2008/0191679 | A1 | * | 8/2008 | Williams | ..................... 323/282 |
| 2008/0211318 | A1 | * | 9/2008 | Wang | .......................... 307/130 |

* cited by examiner

*Primary Examiner*—Adolf Berhane
*Assistant Examiner*—Yemane Mehari
(74) *Attorney, Agent, or Firm*—William B. Kempler; Wade J. Brady, III; Frederick J. Telecky, Jr.

(57) ABSTRACT

A keep alive circuit for recharging bootstrap capacitors in multiple totem-pole switching power stages using N-channel field effect transistor or NPN bipolar junction transistor switching devices during 100% or substantially 100% duty cycle operation of one of the totem pole pairs.

17 Claims, 4 Drawing Sheets

KEEP-ALIVE FOR POWER STAGE WITH MULTIPLE SWITCH NODES

CROSS REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention concerns power stages with multiple switch nodes and more particularly to a keep-alive circuit for the same.

FIG. 1 shows a totem-pole switching power stage 100 that includes a first, active switching device ("switch") 110 and a second switching device ("switch") 120 that are in electrical communication at a common node, referred to as a switch node 115. The first, active switch 110 can be, for example, a mechanical relay, a bipolar junction transistor (BJT), a field effect transistor (FET), an insulated gate bipolar transistor (IGBT), and the like. The second switch 120 can be active like the first switch 110 or passive, e.g., a diode and the like.

The first, active switch 110 is connected to a first power supply ("voltage") rail 130 at a first node 125 and the second switch 120 is connected to a second voltage rail 140 at a second node 135. The voltage potential at each node 125, 135 differs. As a result, when one of the switches is closed, i.e., ON, voltage at the common node 115 approximately equals the voltage on the node of the closed switch. Thus, when the switches 110, 120 are driven in a complementary fashion, the voltage at the common node 115 rapidly changes between approximately equal to the voltage at the first node 125 to approximately equal to the voltage at the second node 135. Typically, during complementary switching, the voltage at the common node 115 spends very little time between the voltages at the first node 125 and at the second node 135.

Generally, due to lower cost, wider availability, and higher performance, circuit designers prefer to use an NPN transistor and/or an N-channel MOSFET as a first, active switch 110 when practical. Problematically, in contrast with PNP transistors and P-channel MOSFETs, in order to provide drive signals to the control terminals, e.g., gates, bases, and the like, NPN and N-channel transistors require a voltage that exceeds the voltage potential at the node 125, 135.

Conventionally, circuit designers address this by providing an external drive voltage and/or by using bootstrap capacitors. The former solution requires increased voltage generation circuitry, which affects system cost and further adds to the voltage stress applied to the drive circuitry. Voltage stresses on the drive circuitry, however, can be reduced by generating a floating supply referenced to the common node 115. Consequently, cost is the major drawback associated with providing an external drive voltage.

In contrast, bootstrap capacitors offer a cost effective solution that also controls voltage stress in the drive circuitry. Referring to FIG. 2, bootstrap capacitors 16, 18 are electrically coupled to the common node and to drive circuitry 11, 17 of the first, active switches HS1, HS2. The bootstrap capacitor 16, 18 is further electrically coupled to a power source BP. During operation, the bootstrap capacitor 16, 18 powers the drive circuitry 11, 17 of the first, active switch HS1, HS2 when the first, active switch HS1, HS2 is closed, i.e., ON.

The power source BP further recharges the bootstrap capacitor 16, 18, when the first, active switch HS1, HS2 is open, i.e., OFF, and the complementary second switch LS1, LS2 is closed, i.e., ON. As a result, for bootstrap capacitors 16, 18 to work, each switch HS1, LS1 (HS2, LS2) of the complementary switching pair SW1 (SW2) must be ON for some portion of the total switching cycle and must be OFF for some portion of the total switching cycle. Otherwise, the bootstrap capacitor 16, 18 is not able to recharge.

Disadvantageously, the efficiency of the power stage is reduced when the complementary switches HS1, LS1 (HS2, LS2) at a switch node SW1 (SW2) are alternately turned ON and OFF during a cycle. Indeed, ideal operation of a power stage may require continuous operation, i.e., no switching, of the complementary switches HS1, LS1 (HS2, LS2) in the switching pair SW1 (SW2).

Accordingly, it would be advantageous to provide a device that recharges bootstrap capacitors without switches to enable continuous operation of complementary switches at a switch node. Moreover, it would be desirable to provide a device for use in multiple switch node power stages having N-channel FET or NPN transistor switches that prevents discharge of the respective bootstrap capacitors when the corresponding N-channel FET or NPN transistor switch is operated at a duty-cycle of 100% or substantially 100%. It would also be desirable to provide a device that prevents over-voltage on the bootstrap capacitors when recharging the bootstrap capacitors.

SUMMARY OF THE INVENTION

A keep alive circuit for recharging bootstrap capacitors in multiple totem-pole switching power stages using N-channel field effect transistor or NPN bipolar junction transistor switching devices during 100% or substantially 100% duty cycle operation of one of the totem pole pairs.

BRIEF DESCRIPTION OF THE SEVERAL VIEWS OF THE DRAWINGS

The invention will be more fully understood by reference to the following Detailed Description of the invention in conjunction with the Drawings, of which.

DETAILED DESCRIPTION OF THE INVENTION

A keep alive circuit for recharging bootstrap capacitors in multiple totem-pole switching power stages using N-channel field effect transistor or NPN bipolar junction transistor switching devices during 100% or substantially 100% duty cycle operation of one of the totem pole pairs is disclosed. The keep alive circuit is adapted to recharge the bootstrap capacitor of a non-switching totem-pole power stage node during periods of continuous operation, when that bootstrap capacitor cannot otherwise recharge. The keep alive circuit enables continuous operation of one of the switches in the non-switching totem-pole power stage node without requiring additional voltage generation to power the switches independent of the switching operation.

Figure 1:
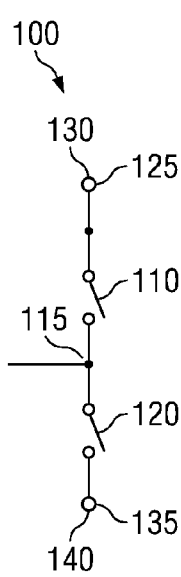
FIG. 1 shows a totem-pole switching node in accordance with the prior art.
Figure 3:
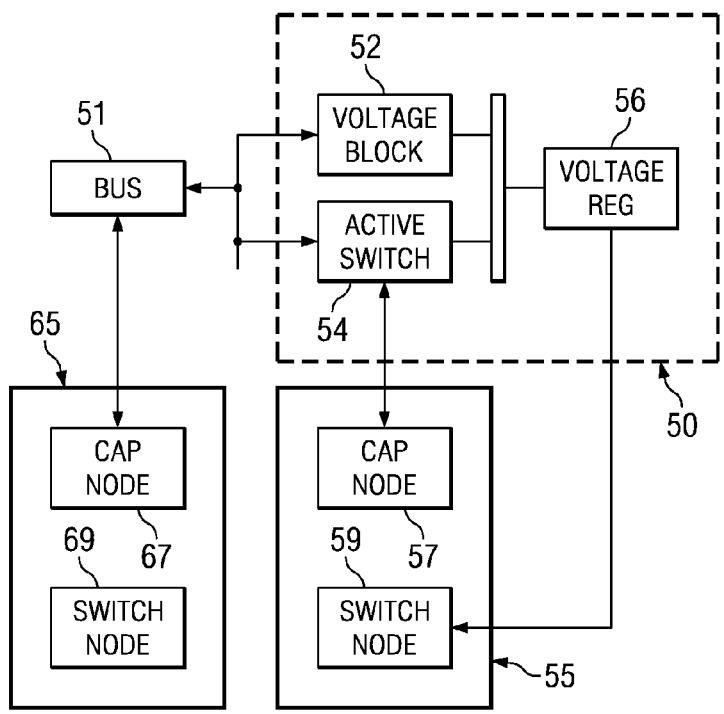
FIG. 3 shows a block diagram of a keep alive circuit in accordance with the present invention.
Figure 2:
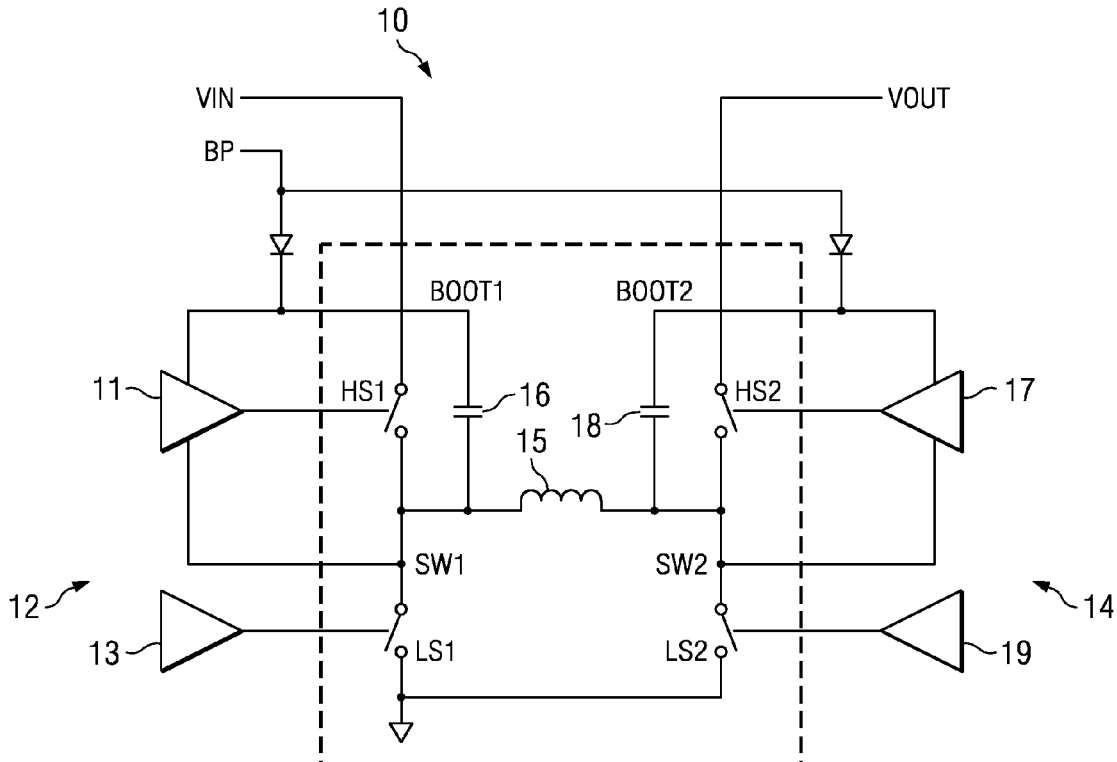
FIG. 2 shows a multiple switch node power stage in accordance with the prior art.

Referring to FIG. 3, a keep alive circuit 50 is shown. The keep alive circuit 50 includes a voltage blocking device 52, an active switching device ("switch") 54, and a voltage regulation device 56. The voltage blocking device 52 can be any device or system that is adapted to conduct current in one direction while blocking current conduction in a reverse direction, such as a diode, a body diode, an active switch, and the like. The active switch 54 can be any device or system that can be selectively driven to conduct or block the flow of current, such as a bipolar junction transistor (BJT), a field effect transistor (FET), an insulated gate bipolar transistor (IGBT), and the like. The voltage regulation device 56 can be any device that is adapted to drive the active switch 54 and, more specifically, to turn off the active switch 54 once a pre-established threshold voltage has been reached. Representative examples of a voltage regulation device 56 include a zener diode, a voltage regulator, a comparator, and the like.

The voltage regulation device 56 is electrically coupled to the control terminal, e.g., gate, base, and the like, of the active switch 54 and to the switch node 59 of the keep alive's associated totem-pole switching power stage 55. The voltage regulation device 56 is adapted to turn off, i.e., to clamp, the active switch 54 when the voltage potential between the bootstrap capacitor node 57 and the switch node 59 exceeds a pre-established threshold voltage.

The active switch 54 is structured and arranged with a first terminal electrically coupled to the bootstrap node 57 of the keep alive's associated totem-pole switching power stage 55 and with a second terminal electrically coupled to a bus node 51. The voltage blocking device 52 is electrically coupled to the voltage regulation device 56 and to the second terminal of the active switch 54 and further electrically coupled to the bootstrap capacitor node 67 of a second totem-pole switching power stage 65.

In operation, when the complementary switches of the second totem-pole switching power stage node 69 are continuously operated, which is to say, operate at a 100 percent or substantially 100 percent duty cycle, the voltage at the bootstrap capacitor node 57 of the first totem-pole switching power stage 55 exceeds the voltage at the second totem-pole switching power stage node 69. When this occurs, current is made to flow from the bootstrap capacitor node 57 of the first totem-pole switching power stage 55 through the voltage blocking device 52 to the bus node 51.

The voltage at the common bus node 51 causes the active switch 54 corresponding to the second totem-pole switching power stage 65 to be turned on, increasing the voltage at the bootstrap capacitor node 69 of the second totem-pole switching power stage 65. The voltage at the bootstrap capacitor node 69 will continue to increase until it equals the voltage at the common bus node 51 or until the voltage regulation device 56 corresponding to the second totem-pole switching power stage 65 turns off, i.e., clamps, the active switch 54 corresponding to the second totem-pole switching power stage 65, preventing further charging.

Figure 4:
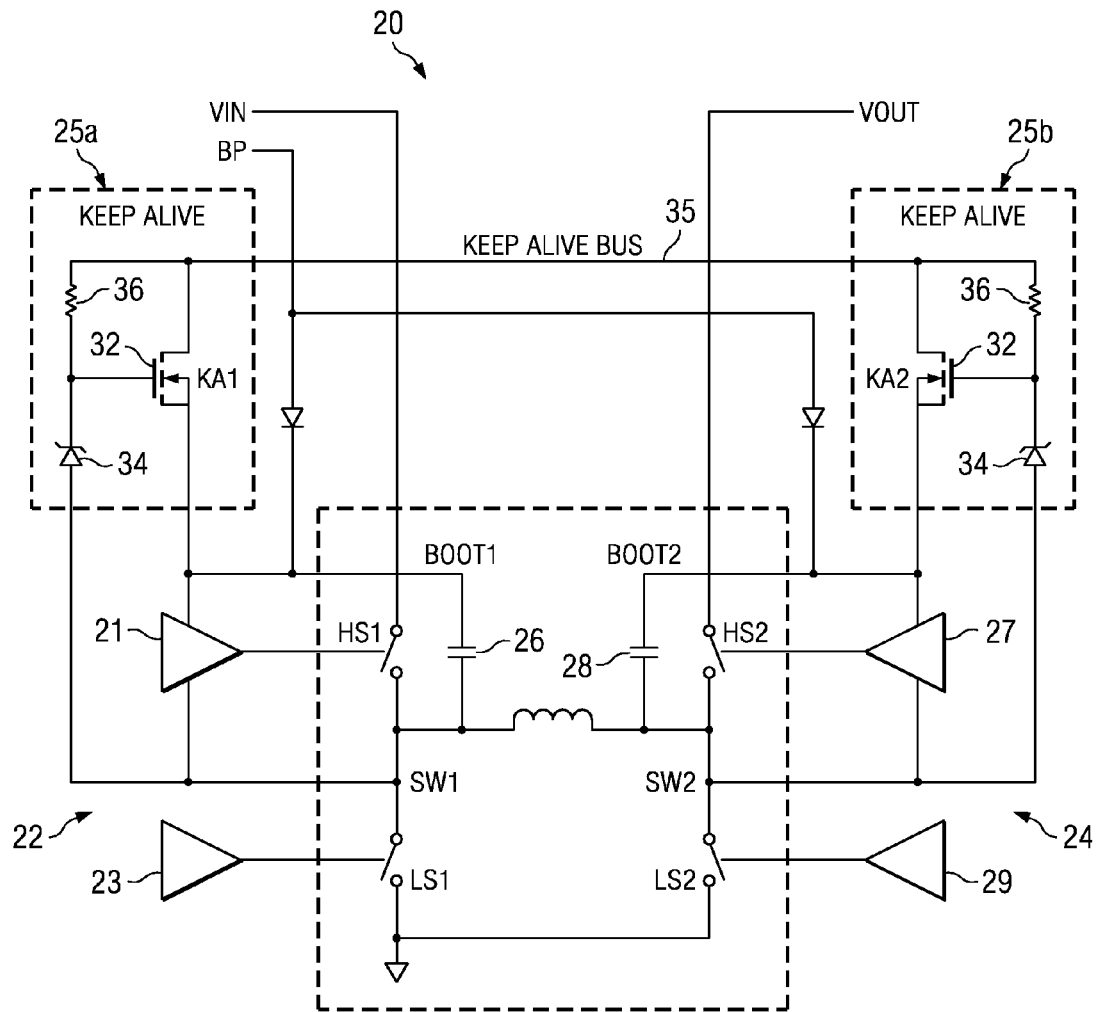
FIG. 4 shows a multiple switch node power stage in accordance with the present invention.

In one application of the disclosed keep alive circuit, a plurality of keep alive circuits electrically coupled to a corresponding plurality of totem-pole switching power stages can be electrically coupled to each other via a common bus node, to provide a cross-powered, self-regulating keep alive circuit. A multi-node, multiple keep alive circuit is shown in FIG. 4. Although there are only two switch nodes SW1, SW2 and two corresponding keep alive circuits 25a, 25b coupled to a common bus node 35 shown in FIG. 4, those of ordinary skill in the art can appreciate that the application can include any number of switch nodes and any number of corresponding keep alive circuits.

According to the present invention, the bootstrap node(s) BOOT1, BOOT2 having the higher voltage potential will source current to the common bus node 35 and any keep alive circuit(s) 25a, 25b whose voltage regulation device 34 has not turned off the corresponding keep alive circuit's active switch 32 will contribute to recharge the bootstrap node capacitor 26, 28 corresponding to the "non-switching" switch node SW1, SW2. In this disclosure, the "non-switching" switch node SW1, SW2 refers to the pair of complementary switches that, during a total switching cycle, continuously operates, which is to say, that one of the switches is closed and one of the switches is open for the duration of the switching cycle. As previously mentioned, a power stage may be most efficient when one of the switches is open and one of the switches is closed for the duration of the switching cycle. The "switching" switch node(s), is/are those pairs of complementary switches whose duty cycles are greater than 0 or substantially 0 and less than 100 percent or substantially 100 percent.

Although FIG. 4 shows a two node, buck-boost power converter 20 and the following description will describe the function of the keep alive circuitry 25 within a buck-boost power converter 20, the invention is not to be construed as being limited thereto. Indeed, those of ordinary skill in the art can appreciate that the teachings of the present invention can be applied to any multiple switch node power converters and, in particular, multiple power stage devices that use N-channel FETs or NPN transistors.

In the FIG. 4, a first bootstrap capacitor 26 is electrically coupled to a first control terminal driver 21, to provide a floating reference voltage to the first switch node SW1 while a second bootstrap capacitor 28 is electrically coupled to a second control terminal driver 27, to provide a floating reference voltage to the second switch node SW2. The floating reference voltages provide power to the corresponding control terminal driver 21 or 27.

More particularly, a first complementary switch pair 22 includes control terminal drivers 21 and 23, which are structured and arranged to power or drive, i.e., turn ON and OFF, the control terminals, e.g., gates, bases, and the like, of switches HS1 and LS1, respectively. A second complementary switch pair 24 includes control terminal drivers 27 and 29, which are structured and arranged to drive the control terminals, e.g., gates, bases, and the like, of switches HS2 and LS2, respectively. Although the control terminal drivers shown in FIG. 4 are comparators, the invention is not to be construed as being limited thereto. Any device that can generate a voltage signal to drive the control terminal of the switching device can be used.

Figure 5:
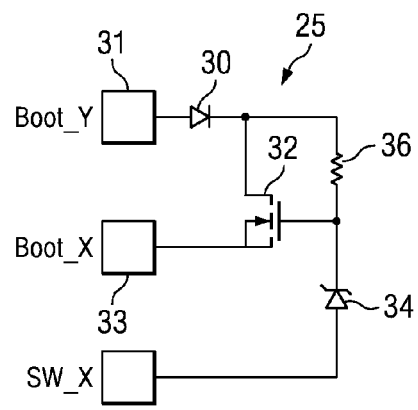
FIG. 5 shows a schematic of a keep alive circuit in accordance with the present invention.

Referring to FIG. 5, "Boot_Y" corresponds to the voltage at the bootstrap capacitor at the "switching" switch node; "Boot_X" corresponds to the voltage at the bootstrap capacitor at the "non-switching" switch node; and "SW_X" corresponds to the voltage at the "non-switching" switch node. The blocking circuitry 30 of the keep alive 25 is adapted, under normal operating conditions, to block the flow of current from the corresponding bootstrap capacitor 31 but, when forward-biased, to provide power to recharge the bootstrap capacitor 33 corresponding to the "non-switching" switch node. Typically, this occurs when the voltage (Boot_Y) at the "switching" switch node's bootstrap capacitor 31 exceeds the voltage on the switch node (SW_X) corresponding to the "non-switching" switch.

The keep alive circuit 25 is structured and arranged so that the voltage at the "non-switching" switch node (SW_X) is regulated by a voltage regulator 34, which is adapted to clamp the control terminal, e.g., gate, base, and the like, of the active switch 32, i.e., to drive the control terminal, e.g., gate, base, and the like, of the keep alive active switch 32, enabling the delivering of voltage to switching node (SW_X), to recharge the bootstrap capacitor 33 corresponding to the "non-switching" switch node. The "non-switching" bootstrap capacitor 33 is recharged until the voltage regulator 34 cuts off the keep alive active switch 32. Cut off occurs at a pre-established voltage threshold. When cut off occurs, further recharging is terminated, which prevents over-voltage damage to the "non-switching" bootstrap capacitor 31.

Preferably, each keep alive circuit 25 uses the body diode of a second or subsequent keep alive circuit 25b as its voltage blocking circuit 30 and the second and subsequent keep alive circuits 25b use the body diode of the first keep alive circuit 25a and other keep-alive circuits 25 for the same purpose. By using the body diode of another keep alive circuit 25, separate, discrete current blocking circuitry 30 is not necessary.

Figure 6:
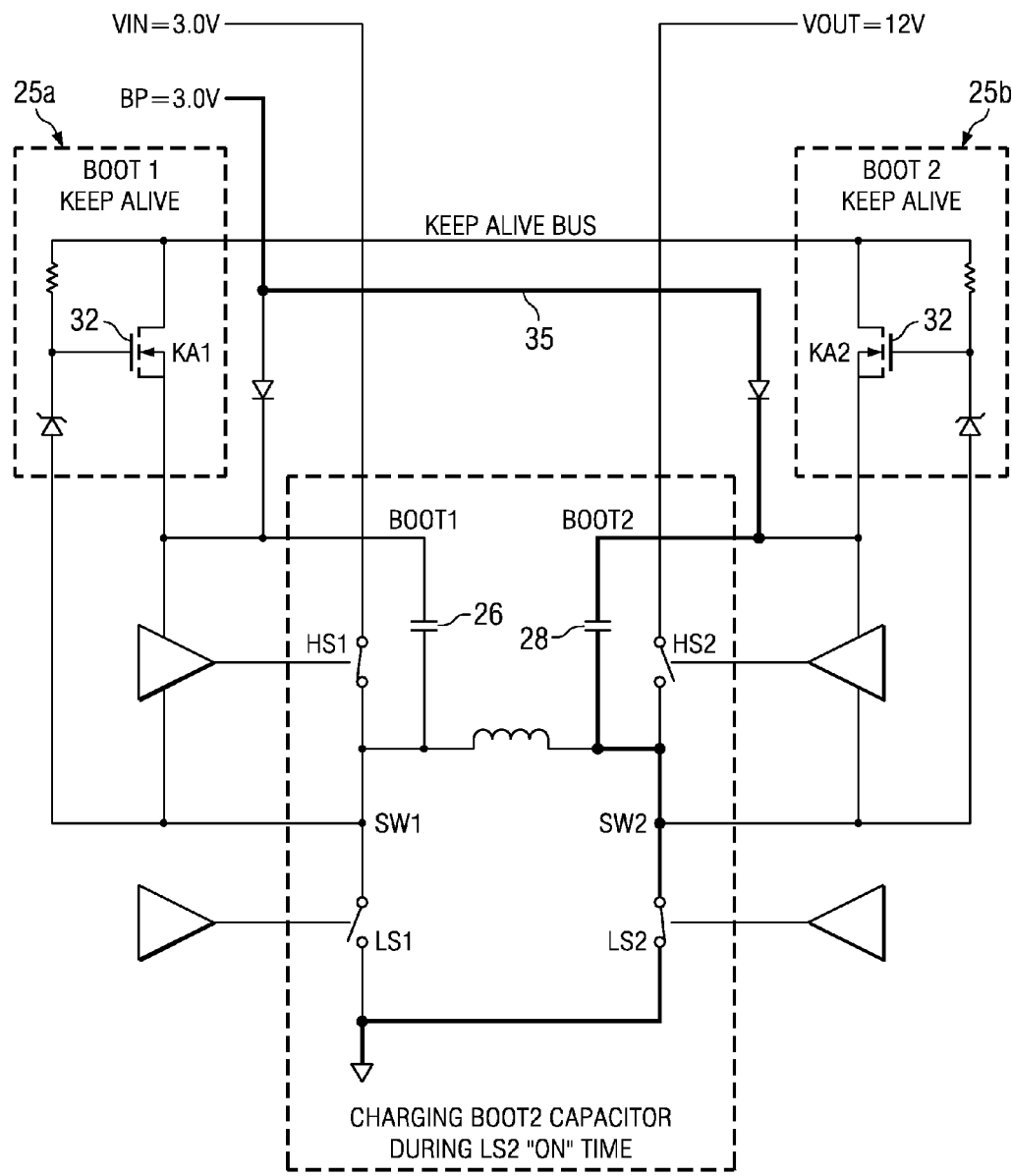
FIG. 6 shows cross-powered self-regulating keep alive circuits between two switch nodes in accordance with the present invention.
Figure 7:
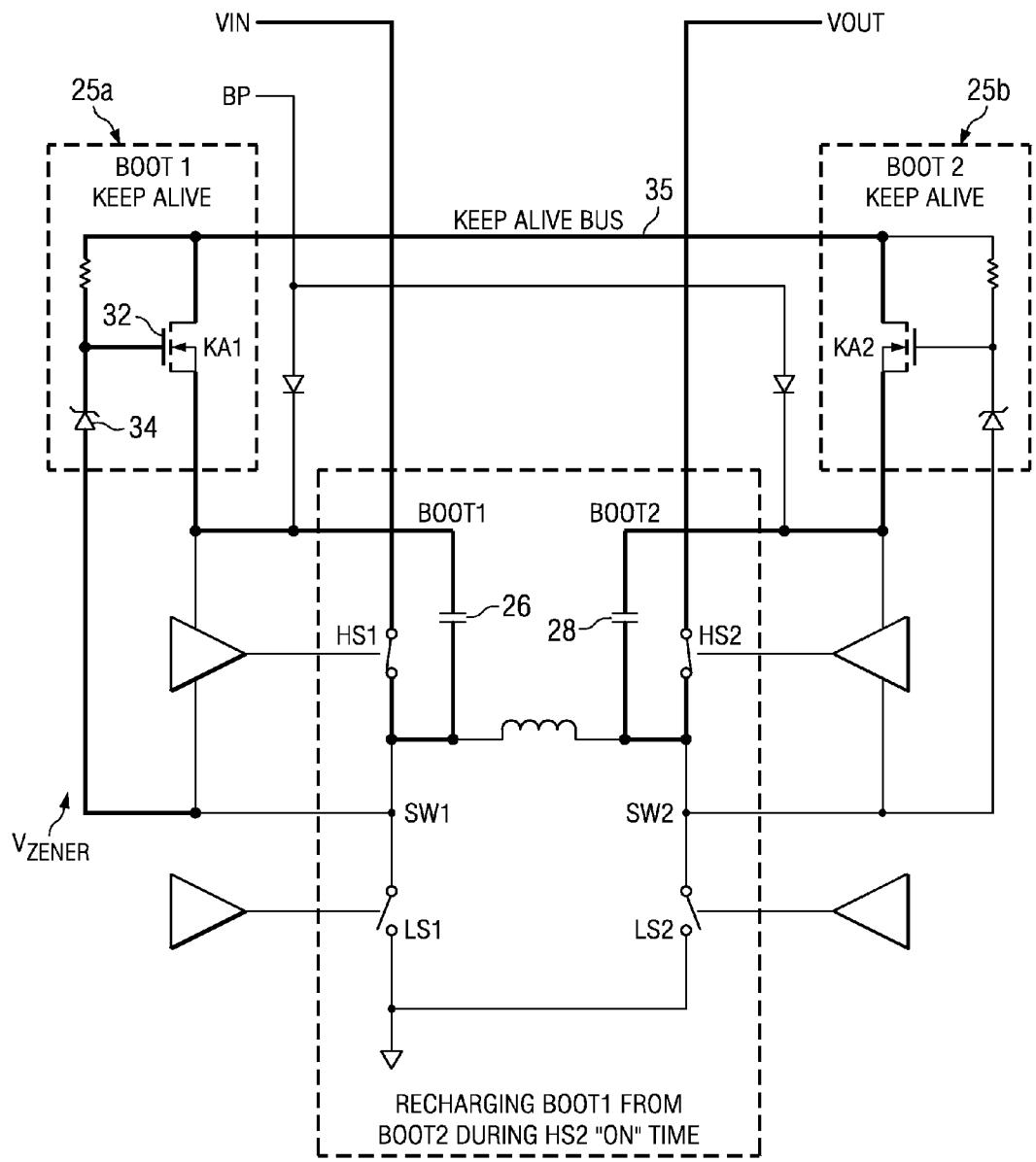
FIG. 7 shows cross-powered self-regulating keep alive circuits between two switch nodes in accordance with the present invention.

FIG. 6 and FIG. 7 show an illustrative 12-Volt power regulator that turns on at 3 Volts. For this discussion, it is assumed that the "non-switching" switch node is SW1 and that the "switching" switch node is SW2. Moreover, switch HS1 has a duty cycle of 100% or substantially 100% and complementary switch LS1 has a duty cycle of 0% or substantially 0%.

The input voltage VIN, the by-pass power source BP voltage, and the voltage at "non-switching" switch node SW1 are equal to 3 Volts. The output voltage VOUT is equal to 12 Volts.

When switch LS2 is being driven, i.e., is turned ON, as shown in FIG. 6, the bootstrap capacitor 28 at the "switching" switch node SW2 is charged to 3 Volts via the by-pass power source BP voltage. At the end of its duty-cycle, after switch LS2 is turned OFF and switch HS2 is turned ON, as shown in FIG. 7, the voltage at switch node SW2 increases from 3 Volts to 12 Volts as the switch node SW2 pulls down 12 Volts from the output voltage VOUT. As a result, at the end of the duty cycle, the voltage at bootstrap capacitor node Boot2 is approximately 15 Volts (12 volts from the switch node SW2 plus 3 volts stored in the bootstrap capacitor 28). The body diode of active switch (KA2) 32 charges the keep alive bus 35 to the same 15 Volts.

The voltage regulator 34 of the second keep alive circuit 25b is adapted to clamp the control terminal, e.g., gate, base, and the like, of the active switch 32 to about 6 Volts. Hence, when bootstrap capacitor 28 reaches 15 Volts, switching device 32 of the second keep alive circuit 25b will conduct current.

On the "non-switching" side of the power regulator 20, the voltage regulator 34 of the first keep alive circuit 25a is adapted to clamp the control terminal, e.g., gate, base, and the like, of the active switch 32. Hence, while the active switch device 32 of the first keep alive circuit 25a conducts current, bootstrap capacitor 26 will be charged by the 15 Volts pulled down from the common bus node 35.

Bootstrap capacitor 26 will continue to charge until the bootstrap capacitor 26 shares the same voltage as the common bus 35, i.e., approximately 15 Volts or, alternatively, until the bootstrap capacitor 26 reaches a voltage that is equal to the mathematical sum of the input voltage VIN plus the voltage associated with the voltage regulator 34, i.e., VZENER, and the voltage regulator 34 clamps the control terminal, e.g., gate, base, and the like, of the active switch 32. Thus, bootstrap capacitor 26 may be charged to a voltage greater than the mathematical sum of the input voltage VIN plus the by-pass power source BP voltage, increasing the available gate drive voltage for the "switching" switch HS1 above the available by-pass power source BP voltage as long as the by-pass power source BP voltage is less than the voltage associated with the voltage regulator 34, i.e., VZENER. This provides the increased benefit of improving the gate drive of switch HS1 at low input voltages because, at low input voltages, switch HS1 may carry continuous current that is greater than the load current.

Although the invention has been described in connection with a four-switch, buck-boost power converter, the invention is not to be construed as being limited thereto. Those of ordinary skill in the art will appreciate that variations to and modification of the above-described device, system, and method are possible. Accordingly, the invention should not be viewed as limited except as by the scope and spirit of the appended claims.

What is claimed is:

1. A keep alive circuit for a bootstrap capacitive element providing a higher base or gate voltage than an active switching device switches for use with a multiple switch node power conversion system having the active switching device comprising at least one N-channel field effect transistor switching device or at least one NPN transistor switching device, the circuit comprising:
    a controllable current or voltage blocking device that is adapted to selectively block current or voltage from escaping from the circuit and to selectively deliver current or voltage to the circuit;
    an active switching device having a control terminal, a first conduction terminal, and a second conduction terminal, the conduction terminals of the active switching device being disposed between the blocking device and a capacitive element and the control terminal adapted to selectively control current flow between said conduction terminals; and
    a voltage regulator that is electrically coupled to the control terminal of the active switching device for clamping said control terminal, wherein a first keep alive circuit at a first switching node receives a regulated floating voltage generated by switching action at a second switching node when a switching device at the first switching node is in substantially continuous operation.

2. The circuit as recited in claim 1, wherein the blocking device is selected from the group consisting of a diode, a body diode or an active switch.

3. The circuit as recited in claim 1, wherein the active switch is selected from the group consisting of a bipolar junction transistor (BJT), a field effect transistor (FET) or an insulated gate bipolar transistor (IGBT).

4. The circuit as recited in claim 1, wherein the voltage regulation device is selected from the group consisting of a zener diode, a voltage regulator, a comparator or an alternate voltage clamping circuit.

5. The circuit as recited in claim 1, wherein the blocking device is a portion of a second keep alive circuit having an active switching device.

6. The circuit as recited in claim 5, wherein the source or the drain electrode of the active switching device is electrically coupled to at least one of a first and a second conduction terminal of the active switching device of the second keep alive circuit.

7. A multiple switch node power stage system, the system comprising:
a multiple switch node power converter including:
a first control terminal driver that is electrically coupled to a first switch node;
a second control terminal driver that is electrically coupled to a second switch node;
each of the first and the second switch nodes including a pair of complementary switched switching devices, at least one of the switching devices being an N-channel field effect transistor switching device or an NPN transistor switching device;
a first bootstrap capacitive element that is electrically coupled to the first control terminal driver and to the first switch node for providing a higher voltage at an output of the first terminal driver than is being switched at the first switch node;
a second bootstrap capacitive element that is electrically coupled to the second control terminal driver and to the second switch node for providing a higher voltage at an output of the second terminal driver than is being switched at the second switch node;
a first keep alive circuit for maintaining voltage on the first capacitive element; and
a second keep alive circuit for maintaining voltage on the second capacitive element and which is electrically coupled to the first keep alive circuit via a bus;
wherein the first keep alive circuit is structured and arranged to provide power to said second bootstrap capacitive element when the at least one N-channel field effect transistor switching device or NPN transistor switching device at the second switch node has a duty-cycle of 100 percent or substantially 100 percent; and
wherein the second keep alive circuit is structured and arranged to provide power to said first bootstrap capacitive element when the at least one N-channel field effect transistor switching device or NPN transistor switching device at the first switch node has a duty-cycle of 100 percent or substantially 100 percent.

8. The system as recited in claim 7, wherein each of the first and second keep alive circuits includes:
a controllable current or voltage blocking device that is adapted to selectively block current or voltage from escaping from the circuit and to selectively deliver current or voltage to the circuit;
an active switching device having a control terminal, a first conduction terminal, and a second conduction terminal, the conduction terminals of the active switching device being disposed between the blocking device and a capacitive element and the control terminal adapted to selectively control current flow between said conduction terminals; and
a voltage regulator that is electrically coupled to the control terminal of the active switching device for clamping said control terminal.

9. The system as recited in claim 7, wherein the current or voltage blocking device for the first keep alive circuit is the source electrode or the drain electrode of the active switching device of the second keep alive circuit.

10. The system as recited in claim 7, wherein the first keep alive circuit is structured and arranged to provide power to the second capacitive element when a voltage at the first switch node exceeds a voltage on the second capacitive element.

11. The system as recited in claim 7, wherein the first keep alive circuit provides power to the second capacitive element using charge stored in the first capacitive element.

12. The system as recited in claim 7, wherein the second keep alive circuit provides power to the first capacitive element using charge stored in the second capacitive element.

13. The system as recited in claim 7, further comprising a switching device that is structured and arranged to selectively control current flow from the first keep alive circuit to the keep alive bus.

14. The system as recited in claim 7, further comprising a switching device that is structured and arranged to selectively control current flow from the second keep alive circuit to the keep alive bus.

15. The system as recited in claim 7, further comprising a switching device that is structured and arranged to selectively control current flow from the keep alive bus to the first keep alive circuit.

16. The system as recited in claim 7, further comprising a switching device that is structured and arranged to selectively control current flow from the keep alive bus to the second keep alive circuit.

17. The system as recited in claim 9, wherein the current or voltage blocking device for the second keep alive circuit is the source electrode or the drain electrode of the active switching device of the first keep alive circuit.

* * * * *